United States Patent [19]
Komori et al.

[11] Patent Number: 5,528,055
[45] Date of Patent: Jun. 18, 1996

[54] THIN-FILM TRANSISTOR

[75] Inventors: Kazunori Komori, Katano; Mamoru Takeda, Hirakata; Yoneharu Takubo, Toyonaka, all of Japan

[73] Assignee: Matsushita Industrial Electric Co., Ltd., Osaka, Japan

[21] Appl. No.: 136,752

[22] Filed: Oct. 15, 1993

[30] Foreign Application Priority Data

Nov. 12, 1992 [JP] Japan .................................. 4-301962

[51] Int. Cl.⁶ .......................... H01L 29/76; H01L 27/108; H01L 29/04
[52] U.S. Cl. .................. 257/66; 257/69; 257/72
[58] Field of Search ................... 257/66, 69, 72, 257/57, 58, 59, 60, 61, 67, 52

[56] References Cited

U.S. PATENT DOCUMENTS

| | | | |
|---|---|---|---|
| 4,772,927 | 9/1988 | Saito et al. | 257/66 |
| 5,036,370 | 7/1991 | Miyago et al. | 257/72 |
| 5,103,274 | 4/1992 | Tang et al. | 357/23.5 |
| 5,140,403 | 8/1992 | Hikichi et al. | 257/52 |
| 5,156,986 | 10/1992 | Wei et al. | 437/40 |

FOREIGN PATENT DOCUMENTS

| | | |
|---|---|---|
| 60-167467 | 8/1985 | Japan . |
| 60-236266 | 11/1985 | Japan . |
| 63-34976 | 2/1988 | Japan . |
| 0168052 | 7/1988 | Japan .................................. 257/57 |
| 1-125867 | 5/1989 | Japan . |
| 1-217422 | 8/1989 | Japan . |

OTHER PUBLICATIONS

"A TFT Array With TaOx/SiNx Double Layered Insulator For Liquid Crystal Displays" by T. Kawaguchi et al: ITEJ Technical Report, vol. 12, No. 50: Nov. 1988: pp. 7–12.

*Primary Examiner*—Wael M. Fahmy
*Attorney, Agent, or Firm*—Rossi & Associates

[57] ABSTRACT

A thin-film transistor of an inverted-staggered structure includes a semiconductor layer with a channel portion, a protective insulating film extending on the channel portion of the semiconductor layer, a source electrode, and a drain electrode. The protective insulating film has a rectangular shape with four corners, and each of two of the corners overlaps one of the source electrode and the drain electrode while two others of the corners overlap neither the source electrode nor the drain electrode. The thin-film transistor may be modified so that one of the corners overlaps one of the source electrode and the drain electrode while three others of the corners overlap neither the source electrode nor the drain electrode.

4 Claims, 4 Drawing Sheets

THIN-FILM TRANSISTOR

BACKGROUND OF THE INVENTION

1. Field of the Invention

This invention relates to a thin-film transistor (TFT). This invention also relates to a method of fabricating a thin-film transistor (TFT).

2. Description of the Prior Art

Liquid crystal displays hold liquid crystal therein and have an array of transparent pixel electrodes for driving pixel-corresponding regions of the liquid crystal. The transparent pixel electrodes are controlled by an array of switching elements generally composed of thin-film transistors (TFT's).

An aperture ratio of a display is an evaluation factor which depends on the ratio of the total area of effective regions of a display screen to the whole area of the display screen. A higher aperture ratio is desirable.

In the liquid crystal display, each of the switching TFT's can be changed between an on state (a conductive state) and an off state (a non-conductive state). A higher internal resistance of the TFT is desirable when the TFT assumes the off state.

ITEJ Technical Report, Vol. 12, No. 50, pp. 7–12, November 1988, discloses a TFT array for a liquid crystal display. As will be explained later, it is generally difficult for the TFT array in the ITEJ documents to simultaneously satisfy both a high aperture ratio and a good TFT off-state characteristic.

SUMMARY OF THE INVENTION

It is an object of this invention to provide an improved thin-film transistor (TFT).

It is another object of this invention to provide a method of fabricating an improved thin-film transistor (TFT).

A first aspect of this invention provides a thin-film transistor of an inverted-staggered structure which comprises a semiconductor layer with a channel portion; a protective insulating film extending on the channel portion of the semiconductor layer; a source electrode; and a drain electrode; wherein the protective insulating film has a rectangular shape with four corners, and each of two of the corners overlaps one of the source electrode and the drain electrode while two others of the corners overlap neither the source electrode nor the drain electrode.

A second aspect of this invention provides a thin-film transistor of an inverted-staggered structure which comprises a semiconductor layer with a channel portion; a protective insulating film extending on the channel portion of the semiconductor layer; a source electrode; and a drain electrode; wherein the protective insulating film has a rectangular shape with four corners, and one of the corners overlaps one of the source electrode and the drain electrode while three others of the corners overlap neither the source electrode nor the drain electrode.

A third aspect of this invention provides a thin-film transistor comprising a semiconductor layer with a channel portion; a protective insulating film extending on the channel portion of the semiconductor layer; a source electrode; and a drain electrode; wherein the protective insulating film has a rectangular shape with four corners, and first one of the four corners overlaps one of the source electrode and the drain electrode while second, third, and fourth ones of the four corners overlap neither the source electrode nor the drain electrode; and wherein the protective insulating film has first and second edge lines extending outward of the source electrode and the drain electrode and between the source electrode and the drain electrode, and the first edge line is provided with said second one of the four corners while the second edge line is provided with said third and fourth ones of the four corners.

A fourth aspect of this invention provides a thin-film transistor comprising a semiconductor layer with a channel portion; a protective insulating film extending on the channel portion of the semiconductor layer; a source electrode; and a drain electrode; wherein the protective insulating film has a rectangular shape with four corners, and each of first and second ones of the four corners overlaps one of the source electrode and the drain electrode while third and fourth ones of the four corners overlap neither the source electrode nor the drain electrode; and wherein the protective insulating film has first and second edge lines extending outward of the source electrode and the drain electrode and between the source electrode and the drain electrode, and the first edge line is provided with said third one of the four corners while the second edge line is provided with said fourth one of the four corners.

A fifth aspect of this invention provides a method of fabricating a thin-film transistor which comprises the steps of forming a semiconductor layer on a substrate, the semiconductor layer having a channel portion; forming a protective insulating film on the channel portion of the semiconductor layer; forming a metal film on the substrate with the semiconductor layer and the protective insulating film, the metal film covering the semiconductor layer and the protective insulating film; and etching off given portions of the metal film and thereby making the metal film into a source electrode and a drain electrode; wherein the protective insulating film has a rectangular shape with four corners, and first one of the four corners overlaps one of the source electrode and the drain electrode while second, third, and fourth ones of the four corners overlap neither the source electrode nor the drain electrode; and wherein the protective insulating film has first and second edge lines extending outward of the source electrode and the drain electrode and between the source electrode and the drain electrode, and the first edge line is provided with said second one of the four corners while the second edge line is provided with said third and fourth ones of the four corners.

A sixth aspect of this invention provides a method of fabricating a thin-film transistor which comprises the steps of forming a semiconductor layer on a substrate, the semiconductor layer having a channel portion; forming a protective insulating film on the channel portion of the semiconductor layer; forming a metal film on the substrate with the semiconductor layer and the protective insulating film, the metal film covering the semiconductor layer and the protective insulating film; and etching off given portions of the metal film and thereby making the metal film into a source electrode and a drain electrode; wherein the protective insulating film has a rectangular shape with four corners, and each of first and second ones of the four corners overlaps one of the source electrode and the drain electrode while third and fourth ones of the four corners overlap neither the source electrode nor the drain electrode; and wherein the protective insulating film has first and second edge lines extending outward of the source electrode and the drain electrode and between the source electrode and the drain electrode, and the first edge line is provided with said third one of the four corners while the second edge line is provided with said fourth one of the four corners.

DESCRIPTION OF THE PREFERRED EMBODIMENTS

Before a description of embodiments of this invention, a prior art thin-film transistor (TFT) will be explained for a better understanding of this invention.

Figure 1:
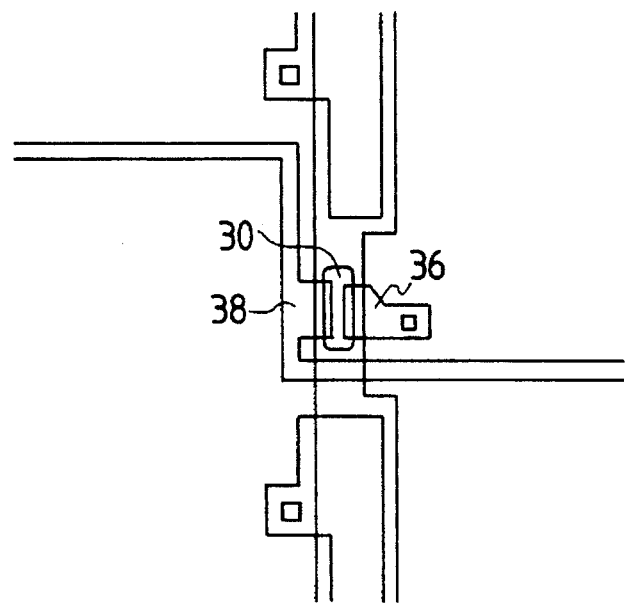
FIG. 1 is a plan view of a portion of a liquid crystal display which includes a prior art thin-film transistor (TFT).
Figure 2:
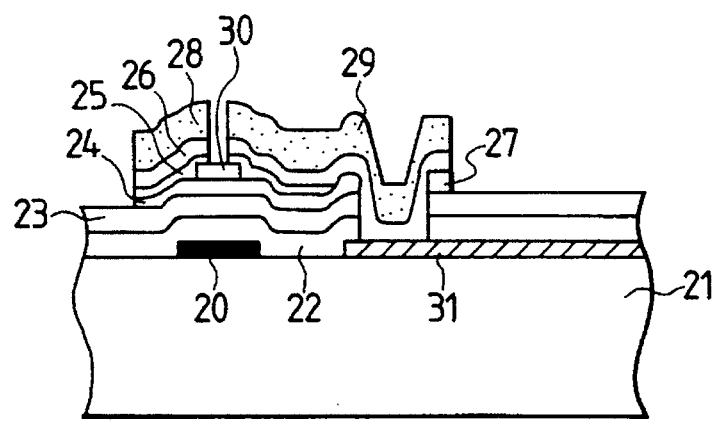
FIG. 2 is a sectional view of the prior art TFT in FIG. 1.

FIGS. 1 and 2 show a prior art TFT for a liquid crystal display which is disclosed in ITEJ Technical Report, Vol. 12, No. 50, pp. 7–12, November 1988. The prior art TFT of FIGS. 1 and 2 has an inverted-staggered structure. As shown in FIG. 2, the prior art TFT includes a gate electrode 20 made of Cr which extends on a glass substrate 21. A gate insulating film extends on the gate electrode 20 and the substrate 21. The gate insulating film is of a double-layered structure having a TaOx layer 22 and an SiNx layer 23. A semiconductor layer 24 made of amorphous silicon (a-Si) extends on the SiNx layer 23. An impurity-doped semiconductor layer 25 made of amorphous silicon (a-Si) extends on the semiconductor layer 24. The impurity-doped semiconductor layer 25 has a conduction type of $n^+$. The impurity-doped semiconductor layer 25 have an opening which vertically aligns with the gate electrode 20. MoSi layers 26 and 27 extend on the impurity-doped semiconductor layer 25. The MoSi layers 26 and 27 are separated from each other by a given gap vertically aligning with the gate electrode 20. Al layers 28 and 29 are superposed on the MoSi layers 26 and 27 respectively. The Al layers 28 and 29 are separated from each other by a given gap vertically aligning with the gate electrode 20. The MoSi layer 26 and the Al layer 28 compose a TFT source electrode. The MoSi layer 28 and the Al layer 29 compose a TFT drain electrode. An insulating layer 30 made of SiNx serves to protect the channel portion of the TFT. The protective insulating layer 30 extends on the semiconductor layer 24. The protective insulating layer 30 extends in the impurity-doped semiconductor layer 25. The protective insulating layer 30 vertically aligns with the gate electrode 20. A transparent display pixel electrode 31 extends on the portion of the substrate 21 which extends outward of the gate electrode 20. The transparent display pixel electrode 31 is electrically connected to the drain electrode. The transparent display pixel electrode 31 is made of indium tin oxide (ITO).

As shown in FIG. 1, the protective insulating layer 30 is of a rectangular shape with four corners which exist at positions outward of the drain electrode 36 and the source electrode 38.

In the liquid crystal display, the area occupied by the TFT is an ineffective region of a display screen. Thus, the aperture ratio of the display decreases as the area occupied by the TFT increases.

In the prior art TFT configuration of FIG. 1, all the four corners of the protective insulating layer 30 exit at positions outward of the drain electrode 36 and the source electrode 38, and the sum of the areas where the protective insulating layer 30 overlaps the drain electrode 36 and the source electrode 38 is relatively small. Since the area occupied by the TFT decreases in accordance with an increase in the sum of the areas where the protective insulating layer 30 overlaps the drain electrode 36 and the source electrode 38, the prior art TFT configuration of FIG. 2 tends to be poor in the display aperture ratio.

Figure 3:
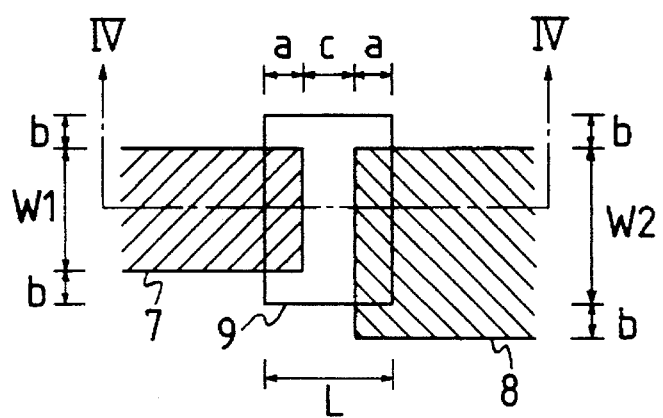
FIG. 3 is a plan view of a thin-film transistor (TFT) according to a first embodiment of this invention.
Figure 4:
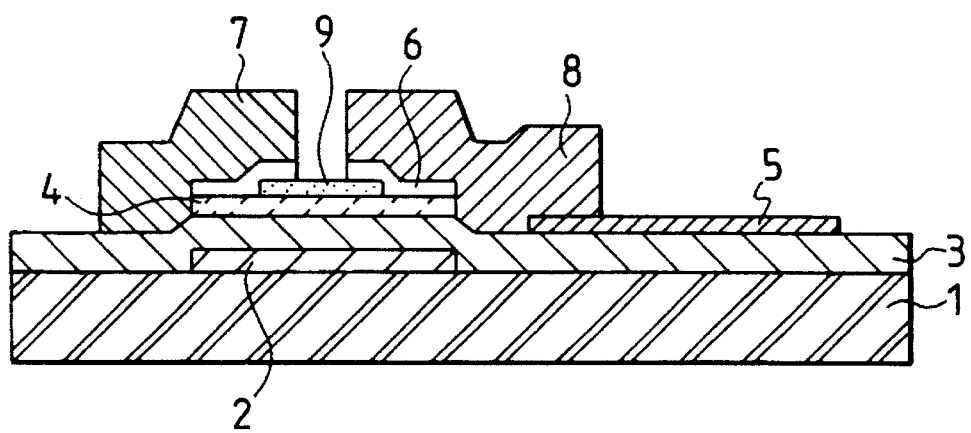
FIG. 4 is a sectional view of the TFT taken along the line IV—IV in FIG. 3.

FIGS. 3 and 4 show a thin-film transistor (TFT) for a liquid crystal display according to a first embodiment of this invention. The TFT of FIGS. 3 and 4 has an inverted-staggered structure. As shown in FIG. 4, the TFT includes a gate electrode 2 extending on an insulating substrate 1. The gate electrode 2 is made of conductive material or metal such as Cr. The insulating substrate 1 is made of, for example, glass. A gate insulating layer 3 extends on the gate electrode 2 and the substrate 1. The gate insulating layer 3 is made of silicon nitride, silicon dioxide, or other insulating material. A semiconductor layer 4 made of amorphous silicon (a-Si) or polycrystalline silicon extends on the gate insulating layer 3. The semiconductor layer 4 has a portion corresponding to a TFT channel portion. The semiconductor layer 4 vertically aligns with the gate electrode 2. An impurity-doped semiconductor layer 6 is superposed on the semiconductor layer 4. The impurity-doped semiconductor layer 6 has a conduction type of $n^+$. The impurity-doped semiconductor layer 6 has an opening which vertically aligns with the gate electrode 2. The impurity-doped semiconductor layer 6 is made of phosphorus-doped amorphous silicon, boron-doped amorphous silicon, phosphorus-doped micro-crystal silicon, boron-doped micro-crystal silicon, phosphorus-doped polycrystalline silicon, or boron-doped polycrystalline silicon. A TFT source electrode 7 extends on a half of the impurity-doped semiconductor layer 6 and a portion of the gate insulating layer 3 which lies outward of the impurity-doped semiconductor layer 6. A TFT drain electrode 8 extends on the other half of the impurity-doped semiconductor layer 6 and a portion of the gate insulating layer 3 which lies outward of the impurity-doped semiconductor layer 6. As shown in FIGS. 3 and 4, the source electrode 7 and the drain electrode 8 are separated from each other by a given gap "c" which vertically aligns with the gate electrode 2. The source electrode 7 and the drain electrode 8 are made of Ti, Al, Mo, or Cr. An insulating layer 9 serves to protect the channel portion of the TFT. The protective insulating layer 9 extends on the portion of the semiconductor layer 4 which corresponds to the TFT channel portion. The protective insulating layer 9 extends in the impurity-doped semiconductor layer 6. The protective insulating layer 9 vertically aligns with the gate electrode 2. The protective insulating layer 9 is made of silicon nitride, silicon dioxide, or other insulating material. A transparent display pixel electrode 5 extends on a portion of the gate insulating layer 3 which extends outward of the semiconductor layer 4. The transparent display pixel electrode 5 contacts the drain electrode 8. Thus, the transparent display pixel electrode 5 is electrically connected to the drain electrode 8. The transparent display pixel electrode 5 is made of, for example, indium tin oxide (ITO).

As shown in FIG. 3, the protective insulating layer 9 is of a rectangular shape with four corners. One of the corners of the protective insulating layer 9 exists at a position directly below the drain electrode 8 whereas the three other corners exist at positions outward of the source electrode 7 and the drain electrode 8. In other words, as seen from the top of the TFT, one of the corners of the protective insulating layer 9 overlaps the drain electrode 8 whereas the three other corners do not overlap the source electrode 7 and the drain electrode 8. Two of the corners are provided at a first edge line of the protective insulating layer 9 which extends outward of the source electrode 7 and the drain electrode 8 and between the source electrode 7 and the drain electrode 8. One of the corners is provided at a second edge line of the protective insulating layer 9 which extends outward of the source electrode 7 and the drain electrode 8 and between the source electrode 7 and the drain electrode 8.

As shown in FIG. 3, each of the corners of the protective insulating layer 9 has a sharp edge with a right angle. It should be noted that the sharp corners of the protective insulating layer 9 may be replaced by rounded corners or bevelled corners.

As shown in FIG. 3, the source electrode 7 has a width W1 smaller than the width W2+b of the drain electrode 8 by twice a distance "b". The protective insulating layer 9 has a width L which is greater than the gap "c" between the source electrode 7 and the drain electrode 8. The area where the protective insulating layer 9 and the drain electrode 8 overlap each other has a width "a". Also, the area where the protective insulating layer 9 and the source electrode 7 overlap each other has a width "a". The width L of the protective insulating layer 9 is equal to the sum of the distances "a", "c", and "a". In the direction along the width W1 of the source electrode 7, opposite ends of the protective insulating layer 9 project outward of the source electrode 7 by equal distances "b".

In general, the area occupied by a TFT is approximately proportional to the area of a protective insulating layer. In cases where a source electrode and a drain electrode have equal widths, the ability (the greatest current which can be driven from the source electrode to the drain electrode) of a TFT is proportional to a value of W/L where W denotes the width of the source electrode and the drain electrode and L denotes the width of a protective insulating layer. The minimum area of the protective insulating layer is determined by characteristics of an apparatus for fabricating the TFT and a desired ability of the TFT.

Figure 5:
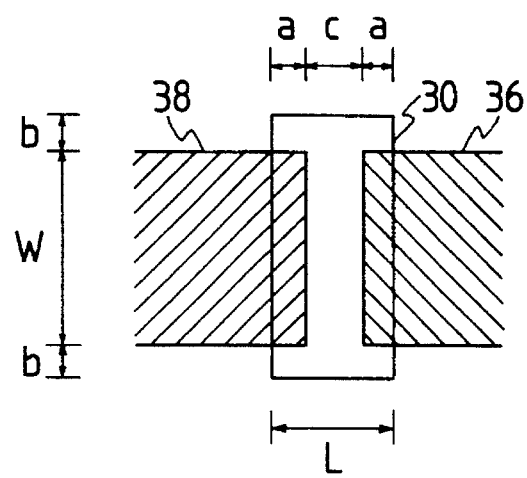
FIG. 5 is a plan view of a prior art TFT.

In the TFT configuration of FIG. 3, the area of the protective insulating layer 9 is equal to a value of {W+(3/2)b}·L where W denotes an average between the lengths W1 and W2. On the other hand, in a prior art TFT configuration of FIG. 5 which corresponds to the prior art TFT configuration of FIG. 1, the area of the protective insulating layer 30 is equal to a value of (W+2b)·L where W denotes the width of the drain electrode 36 and the source electrode 38 and L denotes the width of the protective insulating layer 30. In addition, "b" denotes a distance by which each of opposite ends of the protective insulating layer 30 projects outward of the the drain electrode 36 and the source electrode 38. Accordingly, the area of the protective insulating layer 9 in the TFT configuration of FIG. 3 can be smaller than the area of the protective insulating layer 30 in the prior art TFT configuration of FIG. 5 for a given desired TFT ability.

Generally, a smaller area of a protective insulating layer results in a smaller area occupied by a TFT. In addition, a smaller area occupied by a TFT enables a higher aperture ratio of a display. Thus, the TFT configuration of FIG. 3 is advantageous over the prior art TFT configuration of FIG. 5 in display aperture ratio.

The TFT of FIGS. 3 and 4 was fabricated as follows. First, an insulating substrate 1 was prepared. The insulating substrate 1 was made of, for example, glass. A gate electrode 2 was formed on the insulating substrate 1. The gate electrode 2 was made of conductive material or metal such as Cr. A gate insulating layer 3, a first semiconductor layer, and an insulating layer were sequentially formed on the insulating substrate 1 with the gate electrode 2 by a suitable process such as plasma chemical vapor deposition (P-CVD). The uppermost layer, that is, the insulating layer, was made into a protective insulating layer 9 of a desired shape by a patterning process. This patterning process uncovered portions of the first semiconductor layer which extended outward of the region of the protective insulating layer 9. The gate insulating layer 3 was made of silicon nitride, silicon dioxide, or other insulating material. The first semiconductor layer was made of amorphous silicon (a-Si) or polycrystalline silicon. The protective insulating layer 9 was made of silicon nitride, silicon dioxide, or other insulating material. An impurity-doped semiconductor layer or a second semiconductor layer was superposed on the protective insulating layer 9 and the exposed portions of the first semiconductor layer by a suitable process such as plasma chemical vapor deposition (P-CVD). The second semiconductor layer had a conduction type of $n^+$. The second semiconductor layer was made of phosphorus-doped amorphous silicon, boron-doped amorphous silicon, phosphorus-doped micro-crystal silicon, boron-doped micro-crystal silicon, phosphorus-doped polycrystalline silicon, or boron-doped polycrystalline silicon. The first semiconductor layer and the second semiconductor layer were made into a semiconductor layer 4 and an impurity-doped semiconductor layer 6 of desired shapes respectively by a selective etching process. During the selective etching process, given portions of the protective insulating layer 9 was exposed but withstood etching so that a damage to the semiconductor layer 4 was prevented. The selective etching process uncovered portions of the gate insulating layer 3 which extended outward of the region of the semiconductor layer 4. A transparent film was formed on the gate insulating layer 3, and was made into a transparent display pixel electrode 5 of a desired shape by a patterning process. The transparent pixel electrode 5 was made of, for example, indium tin oxide (ITO). A metal film was formed on the impurity-doped semiconductor layer 6, the transparent pixel electrode 5, and exposed portions of the gate insulating layer 3. The metal film was made into a source electrode 7 and a drain electrode 8 by a patterning process including an etching process. The source electrode 7 and the drain electrode 8 were made of Ti, Al, Mo, or Gr.

As shown in FIG. 3, two corners were provided at a first edge line of the protective insulating layer 9 which extended outward of the source electrode 7 and the drain electrode 8 and between the source electrode 7 and the drain electrode 8. One corner was prodded at a second edge line of the protective insulating layer 9 which extended outward of the source electrode 7 and the drain electrode 8 and between the source electrode 7 and the drain electrode 8. During the etching process to make the metal film into the source electrode 7 and the drain electrode 8, portions adjoining the corners of the protective insulating layer 9 were more easily etched off than other portions (portions adjoining straight or non-cornered edges of the protective insulating layer 9). Thus, the portions adjoining the corners of the protective insulating layer 9 were reliably etched off, and unwanted remaining portions of the metal film and the impurity-doped semiconductor layer were prevented from forming electrically-conductive bridges connecting the source electrode 7 and the drain electrode 8 along the above-mentioned first and second edge lines of the protective insulating layer 9. Such bridges would deteriorate the characteristic of an off state of the TFT. Consequently, the resultant TFT had a good off-state characteristic.

Figure 6:
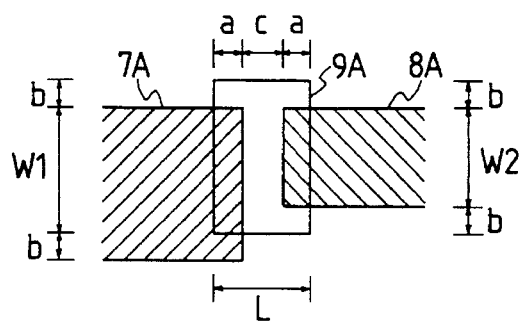
FIG. 6 is a plan view of a thin-film transistor (TFT) according to a second embodiment of this invention.

FIG. 6 shows a second embodiment of this invention which is similar to the embodiment of FIGS. 3 and 4 except for design changes indicated hereinafter.

As shown in FIG. 6, a protective insulating layer 9A is of a rectangular shape with four corners. One of the corners of the protective insulating layer 9A exists at a position directly below a source electrode 7A whereas the three other corners exist at positions outward of the source electrode 7A and a drain electrode 8A. In other words, as seen from the top of the TFT, one of the corners of the protective insulating layer 9A overlaps the source electrode 7A whereas the three other corners do not overlap the source electrode 7A and the drain electrode 8A. Two of the corners are provided at a first edge line of the protective insulating layer 9A which extends outward of the source electrode 7A and the drain electrode 8A and between the source electrode 7A and the drain electrode 8A. One of the corners is provided at a second edge line of the protective insulating layer 9A which extends outward of the source electrode 7A and the drain electrode 8A and between the source electrode 7A and the drain electrode 8A.

As shown in FIG. 6, the source electrode 7A has a width W1+b greater than the width W2 of the drain electrode 8A by twice a distance "b". The protective insulating layer 9A has a width L which is greater than a gap "c" between the source electrode 7A and the drain electrode 8A. The area where the protective insulating layer 9A and the drain electrode 8A overlap each other has a width "a". Also, the area where the protective insulating layer 9A and the source electrode 7A overlap each other has a width "a". The width L of the protective insulating layer 9A is equal to the sum of the distances "a", "c", and "a". In the direction along the width W2 of the drain electrode 8A, opposite ends of the protective insulating layer 9A project outward of the drain electrode 8A by equal distances "b".

In the TFT configuration of FIG. 6, the area of the protective insulating layer 9A is equal to a value of {W+(3/2)b}·L where W denotes an average between the lengths W1 and W2. Accordingly, the area of the protective insulating layer 9A in the TFT configuration of FIG. 6 can be smaller than the area of the protective insulating layer 30 in the prior art TFT configuration of FIG. 5 for a given desired TFT ability. Thus, the TFT configuration of FIG. 6 is advantageous over the prior art TFT configuration of FIG. 5 in display aperture ratio.

Figure 7:
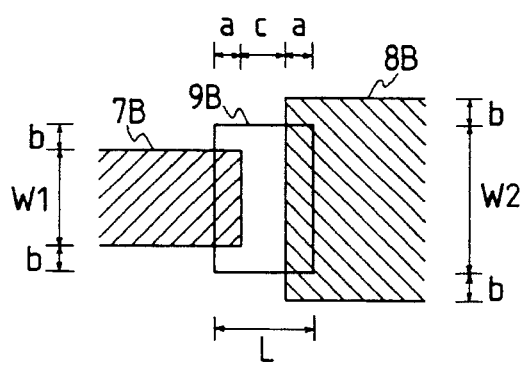
FIG. 7 is a plan view of a thin-film transistor (TFT) according to a third embodiment of this invention.

FIG. 7 shows a third embodiment of this invention which is similar to the embodiment of FIGS. 3 and 4 except for design changes indicated hereinafter.

As shown in FIG. 7, a protective insulating layer 9B is of a rectangular shape with four corners. Two of the corners of the protective insulating layer 9B exist at positions directly below a drain electrode 8B whereas the two other corners exist at positions outward of a source electrode 7B and the drain electrode 8B. In other words, as seen from the top of the TFT, two of the corners of the protective insulating layer 9B overlap the drain electrode 8B whereas the two other corners do not overlap the source electrode 7B and the drain electrode 8B. One of the corners is provided at a first edge line of the protective insulating layer 9B which extends outward of the source electrode 7B and the drain electrode 8B and between the source electrode 7B and the drain electrode 8B. One of the corners is provided at a second edge line of the protective insulating layer 9B which extends outward of the source electrode 7B and the drain electrode 8B and between the source electrode 7B and the drain electrode 8B.

As shown in FIG. 7, the source electrode 7B has a width W1 smaller than the width W2+2b of the drain electrode 8B by four times a distance "b". The protective insulating layer 9B has a width L which is greater than a gap "c" between the source electrode 7B and the drain electrode 8B. The area where the protective insulating layer 9B and the drain electrode 8B overlap each other has a width "a". Also, the area where the protective insulating layer 9B and the source electe-ode 7B overlap each other has a width "a". The width L of the protective insulating layer 9B is equal to the sum of the distances "a", "c", and "a". In the direction along the width W1 of the source electrode 7B, opposite ends of the protective insulating layer 9B project outward of the source electrode 7B by equal distances "b".

In the TFT configuration of FIG. 7, the area of the protective insulating layer 9B is equal to a value of (W+b)·L where W denotes an average between the lengths W1 and W2. Accordingly, the area of the protective insulating layer 9B in the TFT configuration of FIG. 7 can be smaller than the area of the protective insulating layer 30 in the prior art TFT configuration of FIG. 5 for a given desired TFT ability. Thus, the TFT configuration of FIG. 7 is advantageous over the prior art TFT configuration of FIG. 5 in display aperture ratio.

Figure 8:
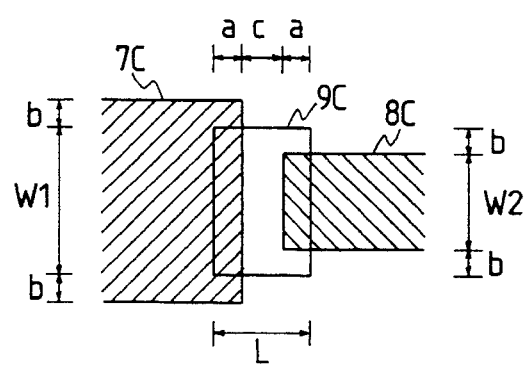
FIG. 8 is a plan view of a thin-film transistor (TFT) according to a fourth embodiment of this invention.

FIG. 8 shows a fourth embodiment of this invention which is similar to the embodiment of FIGS. 3 and 4 except for design changes indicated hereinafter.

As shown in FIG. 8, a protective insulating layer 9C is of a rectangular shape with four corners. Two of the corners of the protective insulating layer 9C exist at positions directly below a source electrode 7C whereas the two other corners exist at positions outward of the source electrode 7C and a drain electrode 8C. In other words, as seen from the top of the TFT, two of the corners of the protective insulating layer 9C overlap the source electrode 7C whereas the two other corners do not overlap the source electrode 7C and the drain electrode 8C. One of the corners is provided at a first edge line of the protective insulating layer 9C which extends outward of the source electrode 7C and the drain electrode 8C and between the source electrode 7C and the drain electrode 8C. One of the corners is provided at a second edge line of the protective insulating layer 9C which extends outward of the source electrode 7C and the drain electrode 8C and between the source electrode 7C and the drain electrode 8C.

As shown in FIG. 8, the source electrode 7C has a width W1+2b greater than the width W2 of the drain electrode 8C by four times a distance "b". The protective insulating layer 9C has a width L which is greater than a gap "c" between the source electrode 7C and the drain electrode 8C. The area where the protective insulating layer 9C and the drain electrode 8C overlap each other has a width "a". Also, the area where the protective insulating layer 9C and the source electrode 7C overlap each other has a width "a". The width L of the protective insulating layer 9C is equal to the sum of the distances "a", "c", and "a". In the direction along the width W2 of the drain electrode 8C, opposite ends of the protective insulating layer 9C project outward of the drain electrode 8C by equal distances "b".

In the TFT configuration of FIG. 8, the area of the protective insulating layer 9C is equal to a value of (W+b)•L where W denotes an average between the lengths W1 and W2. Accordingly, the area of the protective insulating layer 9C in the TFT configuration of FIG. 8 can be smaller than the area of the protective insulating layer 30 in the prior art TFT configuration of FIG. 5 for a given desired TFT ability. Thus, the TFT configuration of FIG. 8 is advantageous over the prior art TFT configuration of FIG. 5 in display aperture ratio.

Figure 9:
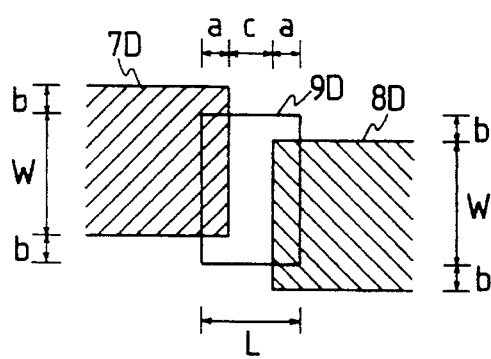
FIG. 9 is a plan view of a thin-film transistor (TFT) according to a fifth embodiment of this invention.

FIG. 9 shows a fifth embodiment of this invention which is similar to the embodiment of FIGS. 3 and 4 except for design changes indicated hereinafter.

As shown in FIG. 9, a protective insulating layer 9D is of a rectangular shape with four corners. Two of the corners of the protective insulating layer 9D exist at positions directly below a source electrode 7D and a drain electrode 8D respectively whereas the two other corners exist at positions outward of the source electrode 7D and the drain electrode 8D. In other words, as seen from the top of the TFT, two of the corners of the protective insulating layer 9D overlap the source electrode 7D and the drain electrode 8D respectively whereas the two other corners do not overlap the source electrode 7D and the drain electrode 8D. One of the corners is provided at a first edge line of the protective insulating layer 9D which extends outward of the source electrode 7D and the drain electrode 8D and between the source electrode 7D and the drain electrode 8D. One of the corners is provided at a second edge line of the protective insulating layer 9D which extends outward of the source electrode 7D and the drain electrode 8D and between the source electrode 7D and the drain electrode 8D.

As shown in FIG. 9, the source electrode 7D has a width W+b equal to the width W+b of the drain electrode 8D. The protective insulating layer 9D has a width L which is greater than a gap "c" between the source electrode 7D and the drain electrode 8D. The area where the protective insulating layer 9D and the drain electrode 8D overlap each other has a width "a". Also, the area where the protective insulating layer 9D and the source electrode 7D overlap each other has a width "a". The width L of the protective insulating layer 9D is equal to the sum of the distances "a", "c", and "a". In the direction along the width W+b of the source electrode 7D, an end of the protective insulating layer 9D projects outward of the source electrode 7D by a distance "b". In the direction along the width W+b of the drain electrode 8D, an end of the protective insulating layer 9D projects outward of the drain electrode 8D by a distance "b".

In the TFT configuration of FIG. 9, the area of the protective insulating layer 9D is equal to a value of (W+b)•L. Accordingly, the area of the protective insulating layer 9D in the TFT configuration of FIG. 9 can be smaller than the area of the protective insulating layer 30 in the prior art TFT configuration of FIG. 5 for a given desired TFT ability. Thus, the TFT configuration of FIG. 9 is advantageous over the prior art TFT configuration of FIG. 5 in display aperture ratio.

Figure 10:
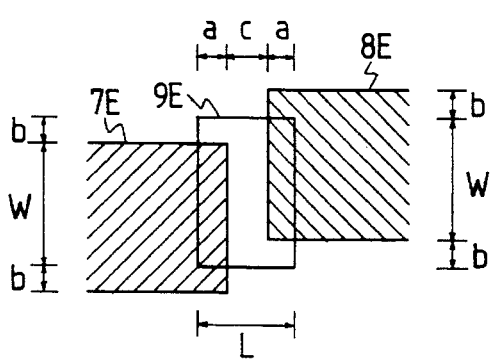
FIG. 10 is a plan view of a thin-film transistor (TFT) according to a sixth embodiment of this invention.

FIG. 10 shows a sixth embodiment of this invention which is similar to the embodiment of FIGS. 3 and 4 except for design changes indicated hereinafter.

As shown in FIG. 10, a protective insulating layer 9E is of a rectangular shape with four corners. Two of the corners of the protective insulating layer 9E exist at positions directly below a source electrode 7E and a drain electrode 8E respectively whereas the two other corners exist at positions outward of the source electrode 7E and the drain electrode 8E. In other words, as seen from the top of the TFT, two of the corners of the protective insulating layer 9E overlap the source electrode 7E and the drain electrode 8E respectively whereas the two other corners do not overlap the source electrode 7E and the drain electrode 8E. One of the corners is provided with a first edge line of the protective insulating layer 9E which extends outward of the source electrode 7E and the drain electrode 8E and between the source electrode 7E and the drain electrode 8E. One of the corners is provided at a second edge line of the protective insulating layer 9E which extends outward of the source electrode 7E and the drain electrode 8E and between the source electrode 7E and the drain electrode 8E.

As shown in FIG. 10, the source electrode 7E has a width W+b equal to the width W+b of the drain electrode 8E. The protective insulating layer 9E has a width L which is greater than a gap "c" between the source electrode 7E and the drain electrode 8E. The area where the protective insulating layer 9E and the drain electrode 8E overlap each other has a width "a". Also, the area where the protective insulating layer 9E and the source electrode 7E overlap each other has a width "a". The width L of the protective insulating layer 9E is equal to the sum of the distances "a", "c", and "a". In the direction along the width W+b of the source electrode 7E, an end of the protective insulating layer 9E projects outward of the source electrode 7E by a distance "b". In the direction along the width W+b of the drain electrode 8E, an end of the protective insulating layer 9E projects outward of the drain electrode 8E by a distance "b".

In the TFT configuration of FIG. 10, the area of the protective insulating layer 9E is equal to a value of (W+b)•L. Accordingly, the area of the protective insulating layer 9E in the TFT configuration of FIG. 10 can be smaller than the area of the protective insulating layer 30 in the prior art TFT configuration of FIG. 5 for a given desired TFT ability. Thus, the TFT configuration of FIG. 10 is advantageous over the prior art TFT configuration of FIG. 5 in display aperture ratio.

Figure 11:
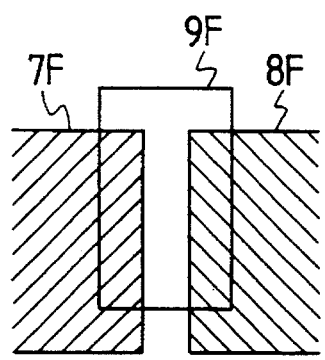
FIG. 11 is a plan view of a thin-film transistor (TFT) according to a seventh embodiment of this invention.

FIG. 11 shows a seventh embodiment of this invention which is similar to the embodiment of FIGS. 3 and 4 except for design changes indicated hereinafter.

As shown in FIG. 11, a protective insulating layer 9F is of a rectangular shape with four corners. Two of the corners of the protective insulating layer 9F exist at positions directly below a source electrode 7F and a drain electrode 8F respectively whereas the two other corners exist at positions outward of the source electrode 7F and the drain electrode 8F. In other words, as seen from the top of the TFT, two of the corners of the protective insulating layer 9F overlap the source electrode 7F and the drain electrode 8F respectively whereas the two other corners do not overlap the source electrode 7F and the drain electrode 8F. Two of the corners are provided at a first edge line of the protective insulating layer 9F which extends outward of the source electrode 7F and the drain electrode 8F and between the source electrode 7F and the drain electrode 8F. None of the corners is provided at a second edge line of the protective insulating layer 9F which extends outward of the source electrode 7F and the drain electrode 8F and between the source electrode 7F and the drain electrode 8F.

What is claimed is:

1. A thin-film transistor of an inverted-staggered structure which comprises:

a semiconductor layer with a channel portion;

a protective insulating film extending on the channel portion of the semiconductor layer;

a source electrode; and a drain electrode;

wherein the protective insulating film has a rectangular shape with four corners, and each of two of the corners overlaps one of the source electrode and the drain electrode while two others of the corners overlap neither the source electrode nor the drain electrode; and wherein a first one of the corners overlaps the source electrode, and a second one of the corners overlaps the drain electrode.

2. A thin-film transistor of an inverted-staggered structure which comprises:

a semiconductor layer with a channel portion;

a protective insulating film extending on the channel portion of the semiconductor layer;

a source electrode; and a drain electrode connected to a transparent display pixel electrode;

wherein the protective insulating film has a rectangular shape with four corners, and wherein one of the corners overlaps the drain electrode while three others of the corners overlap neither the source electrode nor the drain electrode.

3. A thin-film transistor comprising:

a semiconductor layer with a channel portion;

a protective insulating film extending on the channel portion of the semiconductor layer;

a source electrode; and a drain electrode connected to a transparent display pixel electrode;

wherein the protective insulating film has a rectangular shape with four corners, and first one of the four corners overlaps the drain electrode while second, third, and fourth ones of the four corners overlap neither the source electrode nor the drain electrode; and wherein the protective insulating film has first and second edge lines extending outward of the source electrode and the drain electrode and between the source electrode and the drain electrode, and the first edge line is provided with said second one of the four corners while the second edge line is provided with said third and fourth ones of the four corners.

4. A thin-film transistor comprising:

a semiconductor layer with a channel portion;

a protective insulating film extending on the channel portion of the semiconductor layer;

a source electrode; and a drain electrode connected to a transparent display pixel electrode;

wherein the protective insulating film has a rectangular shape with four corners, and each of first and second ones of the four corners overlaps the drain electrode while third and fourth ones of the four corners overlap neither the source electrode nor the drain electrode; and wherein the protective insulating film has first and second edge lines extending outward of the source electrode and the drain electrode and between the source electrode and the drain electrode, and the first edge line is provided with said third one of the four corners while the second edge line is provided with said fourth one of the four corners.

* * * * *